United States Patent
Krishna et al.

(10) Patent No.: US 8,134,141 B2
(45) Date of Patent: *Mar. 13, 2012

(54) DETECTOR WITH TUNABLE SPECTRAL RESPONSE

(75) Inventors: Sanjay Krishna, Albuquerque, NM (US); J. Scott Tyo, Edgwood, NM (US); Majeed M. Hayat, Albuquerque, NM (US); Sunil Raghavan, Albuquerque, NM (US); Unal Sakoglu, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 423 days.

This patent is subject to a terminal disclaimer.

(21) Appl. No.: 11/695,429

(22) Filed: Apr. 2, 2007

(65) Prior Publication Data
US 2007/0252134 A1 Nov. 1, 2007

Related U.S. Application Data

(63) Continuation of application No. 10/948,839, filed on Sep. 22, 2004, now Pat. No. 7,217,951.

(60) Provisional application No. 60/505,076, filed on Sep. 23, 2003.

(51) Int. Cl.
*H01L 31/0304* (2006.01)
(52) U.S. Cl. ... 257/21; 257/184; 257/440; 257/E29.071; 257/E31.059; 257/E27.135; 250/370.14
(58) Field of Classification Search ............ 257/21
See application file for complete search history.

(56) References Cited

U.S. PATENT DOCUMENTS

| 5,291,034 | A | | 3/1994 | Allam et al. |
| 5,936,258 | A | * | 8/1999 | Imamura et al. ............... 257/21 |
| 6,239,449 | B1 | * | 5/2001 | Fafard et al. .................... 257/17 |
| 6,657,195 | B1 | | 12/2003 | Martin et al. |
| 2005/0017176 | A1 | * | 1/2005 | Koch et al. ................ 250/338.4 |
| 2005/0061986 | A1 | * | 3/2005 | Kardynal et al. ......... 250/370.01 |

OTHER PUBLICATIONS

Towe et al., "Semiconductor Quantum-Dot . . . Photodetector" IEEE J.of SelectedTopics in Quantum Electronics, vol. 6 No. 3 May/Jun. 2000pp. 408-421.*
Notification of Transmittal of the International Search Report and the Written Opinion, PCT/US04/31381, Nov. 30, 2005, 7 pages.
Raghavan, S. et al., High-Responsivity, Normal-Incidence Long-Wave Infrared (λ~7.2 μm) InAs/In0.15Ga0.85As dots-in-a-well detector, Applied Physics Letters, Aug. 19, 2002, pp. 1369-1371, vol. 81, No. 8.

* cited by examiner

*Primary Examiner* — Jerome Jackson, Jr.
(74) *Attorney, Agent, or Firm* — MH2 Technology Law Group

(57) ABSTRACT

A semiconductor detector has a tunable spectral response. These detectors may be used with processing techniques that permit the creation of "synthetic" sensors that have spectral responses that are beyond the spectral responses attainable by the underlying detectors. For example, the processing techniques may permit continuous and independent tuning of both the center wavelength and the spectral resolution of the synthesized spectral response. Other processing techniques can also generate responses that are matched to specific target signatures.

16 Claims, 12 Drawing Sheets

Parameters used for the three simulated sensing modes

| Mode | # of Bands | Band Centers | Desired Resolution |
|---|---|---|---|
| Hyperspectral | 200 | 3.5 – 10.5 μm (every .05 μm) | 0.5 μm |
| Multispectral | 7 | 4 – 10 μm (every 1 μm) | 1 μm |
| Multispectral | 3 | 5 μm, 7.5 μm, 9.5 μm | 2 μm, 1 μm, 2 μm |

7-Band multispectral reconstruction

| Reconstruction of 3.0-mm Polystyrene filter spectrum (W/cm⁻¹) | | | |
|---|---|---|---|
| Center (μm) | actual | ideal | synthesized |
| 4.0 | 0.6887 | 0.6073 | 05969 |
| 5.0 | 0.7905 | 0.7391 | 0.7358 |
| 6.0 | 0.6211 | 0.5657 | 0.5753 |
| 7.0 | 0.3315 | 0.3705 | 0.3920 |
| 8.0 | 0.5330 | 0.3529 | 0.3349 |
| 9.0 | 0.5745 | 0.4791 | 0.5080 |
| 10.0 | 0.2967 | 0.4019 | 0.3958 |
| Reconstruction of blackbody spectrum (normalized) (W/cm⁻¹) | | | |
| Center (μm) | actual | ideal | synthesized |
| 4.0 | 0.7029 | 0.6926 | 0.6807 |
| 5.0 | 0.8484 | 0.8548 | 0.8510 |
| 6.0 | 0.9532 | 0.9420 | 0.9580 |
| 7.0 | 0.9994 | 0.9525 | 1.0077 |
| 8.0 | 0.9881 | 1.0280 | 0.9753 |
| 9.0 | 0.9012 | 0.8672 | 0.9194 |
| 10.0 | 0.8452 | 0.8709 | 0.8575 |

FIG. 15A

3-Band multispectral reconstruction

| Reconstruction of 3.0-mm Polystyrene filter spectrum (W/cm⁻¹) | | | |
|---|---|---|---|
| Center (μm) | actual | ideal | synthesized |
| 5.0 | 0.6887 | 0.7244 | 0.7133 |
| 7.5 | 0.2758 | 0.3330 | 0.3223 |
| 9.5 | 0.3840 | 0.4340 | 0.4478 |
| Reconstruction of blackbody spectrum (normalized) (W/cm⁻¹) | | | |
| center (μm) | actual | ideal | synthesized |
| 5.0 | 0.7029 | 0.8424 | 0.8296 |
| 7.5 | 0.9998 | 1.0271 | 0.9940 |
| 9.5 | 0.8669 | 0.8599 | 0.8872 |

FIG. 15B

DETECTOR WITH TUNABLE SPECTRAL RESPONSE

CROSS-REFERENCE TO RELATED APPLICATION

This application is a continuation of U.S. patent application Ser. No. 10/948,839, filed Sep. 22, 2004, now U.S. Pat. No. 7,217,951 which claims priority under 35 U.S.C. §119(e) to U.S. Provisional Patent Application Ser. No. 60/505,076, "Spectrally adaptive quantum dots in a well detector," filed Sep. 23, 2003. The subject matter of the foregoing is incorporated herein by reference in its entirety.

BACKGROUND OF THE INVENTION

1. Field of the Invention

This invention relates generally to detectors with tunable spectral responses, including for example infrared (IR) detectors.

2. Description of the Related Art

For many applications in infrared sensing, it would be desirable to use a focal plane array (hereinafter referred to as "FPA") with a tunable spectral response that can be tuned to aid in the detection of a particular type of target or the classification of a target to one of known classes of targets. The spectral response ideally could be optimized for use under particular imaging or detection/classification scenarios or to generate multispectral or hyperspectral images, which have a spectral radiance sampled at many wavelengths at each pixel in a scene. Typically, spectral tunability is obtained using an optical or electro-optical technique.

For example, one approach to spectral tunability uses multiple and/or tunable wavelength filters located upstream of the detector elements. This approach typically is capable of implementing between approximately 3 to 15 spectral bands. Images for the different spectral bands can be collected sequentially in time, by using a single detector element (or focal plane) and switching (or spectrally tuning) the wavelength filters as a function of time. Alternately, the different spectral bands can be collected simultaneously in time by using multiple detector elements, each utilizing a different wavelength filter. However, a mechanical switching or tuning system limits the frame-rate of the device and can be cumbersome and prone to mechanical failure. On the other hand, the use of multiple focal planes typically requires complex optical systems, which also lead to bulky and expensive solutions that are limited in the total number of available spectral bands.

Because of these limitations, hyperspectral sensors with more than 100 spectral bands typically use some sort of a shearing optic, such as a grating or prism, to separate the light incident on the sensor into either spectral or interferometric paths. A first spatial dimension of the FPA is typically used to collect the spectral data and a second spatial dimension is sued to collect a line image. The second spatial dimension is obtained through scanning. Other strategies instantaneously collect all of the spectral data by sacrificing spatial resolution through the subdivision of the array.

In another approach, the detector array consists essentially of two or three separate detector arrays stacked on top of each other, with each detector array designed to be sensitive to a different spectral band. For example, one array may be sensitive to the mid-wave infrared band and another array may be sensitive to the long-wave infrared band. These types of FPAs are typically referred to as two- or three-color cameras. The different detectors are electronically activated so that the FPA can switch between the two different wavelength bands. However, these cameras are limited to a very small number of spectral bands, typically two or three, and require a complex detector structure and read-out electronics just to achieve that. Furthermore, they are typically limited to switching between the two spectral bands, which are fixed in spectral response. They typically cannot implement continuous or fine-tuning of the spectral response. For example, the spectral response typically cannot be tuned to an arbitrary center wavelength and spectral width.

Among non-tunable IR detectors, quantum dot infrared photodetectors (QDIPs) have shown steady progress in their performance ever since their first demonstration. The design, performance characteristics, and limitations of prior art QDIPs, such as dots-in-well (DWELL) detectors, are reviewed by Raghavan et al., in Applied Physics Letters Vol. 81 Number 8, Aug. 19, 2002, which is hereby incorporated by reference. QDIPs have demonstrated normal incidence operation in the mid-wave infrared (MWIR, between approximately 3 and 5 µm), the ling wave infrared (LWIR, between approximately 8-12 µm) and in the very ling wave infrared (VLWIR, for wavelengths longer than approximately 14 µm). For certain forward-looking infrared applications, such a broadband response may be desirable. For multispectral/hyperspectral imaging applications, however, it is not.

Thus, there is a need for semiconductor detectors with tunable spectral responses, especially responses that can be tuned by electrical signals, including for use in the IR, typically 2-30 µm. There is also a need for detectors with tunable and narrow spectral bands suitable for use with multispectral/hyperspectral imaging.

SUMMARY OF THE INVENTION

The present invention overcomes the limitations of the prior art by providing a semiconductor detector with a tunable spectral response. These detectors may further be used with processing techniques that permit the creation of "synthetic" sensors that have spectral responses that are beyond the spectral responses attainable by the underlying detectors. For example, the processing techniques may permit continuous and independent tuning of both the center wavelength and the spectral resolution of the synthesized spectral response. These detectors are suitable for use as individual devices and also in arrays. When used in arrays, the detectors in the array may be individual tuned, they can be tuned in groups or the entire array can be commonly tuned.

In one aspect of the invention, the detector structure includes an electronically tunable absorbing region that is based on intersubband transitions of quantum states. Asymmetry in the absorbing region causes asymmetry in the local potential seen by carriers. As a result, the spectral response of the absorbing region can be tuned by changing a bias electric field in the region, typically achieved by changing a bias voltage applied across the region.

In one particular design, the absorbing region utilizes a DWELL design based on a sandwich of a quantum well region, followed by a quantum dot region, followed by another quantum well region. The two quantum well regions are not identical, thus introducing asymmetry. For example, the region may be composed of different materials and/or different layer thicknesses. The sandwich structure is typically repeated to form the absorbing region of the detector. In one specific implementation, self-assembled InAs quantum dots are situated within $In_xGa_{1-x}As$ quantum well regions, which are flanked by GaAs barrier regions. The device is grown on a GaAs substrate.

In another aspect of the invention, processing is used to further enhance and/or diversify the tunability of the tunable detector. In one approach, the detector is tuned to different spectral responses and the detector outputs for each of these are combined in a manner so that the combined output effectively synthesizes some desired spectral response. The desired spectral response may be a response that the detector itself is not physically capable of generating. For example, the synthesized spectral response may have a center wavelength not attainable by the detector or a spectral width that is narrower than that of the detector at any applied bias voltage.

In one approach, the spectral responses of the detector at pre-selected bias voltages are first determined. These form a basis set of spectral responses for the detector. To synthesize a target spectral response, the target spectral response is projected onto the detector's basis set of spectral responses to determine weightings for each of the basis spectral responses. When the detector is exposed to a scene, the detector cycles through each of the bias voltages and the resulting outputs are combined according to their relative weighting.

In one application, this approach can be used to emulate a multispectral or hyperspectral sensor. Such a sensor has a number of bands and outputs a separate signal for each band. Weights are determined for emulation of each of the bands. The tunable detector cycles through its bias voltages to produce outputs that correspond to its basis spectral responses. These outputs are combined using the weights for band 1 in order to synthesize the output for band 1, combined using the weights for band 2 to synthesize the output for band 2, and so on. Thus, a single detector structure (or arrays of detectors for imaging applications) can be used to perform hyperspectral or multispectral imaging, thereby reducing the cost and complexity of many applications.

In another approach, rather than trying to emulate a target spectral response, data is analyzed directly in "bias voltage" space (or whatever the tuning parameter is). For example, a particular object may have a specific signature as a function of bias voltage. It produces response R1 at bias voltage V1, R2 at bias voltage V2 and so on. If a sensor is looking for the presence or absence of that object, the responses can be used to create a classifier such as a matched filter of the function R(V). The matched filter may be a linear or a non-linear combination of the responses.

Other aspects of the invention include methods, devices, apparatus, systems and applications of the concepts described above.

BRIEF DESCRIPTION OF THE DRAWINGS

The invention has other advantages and features which will be more readily apparent from the following detailed description of the invention and the appended claims, when taken in conjunction with the accompanying drawings, in which:

FIGS. 15A-15B are tables showing results of multispectral reconstruction of objects.

DETAILED DESCRIPTION OF THE PREFERRED EMBODIMENTS

Figure 1:
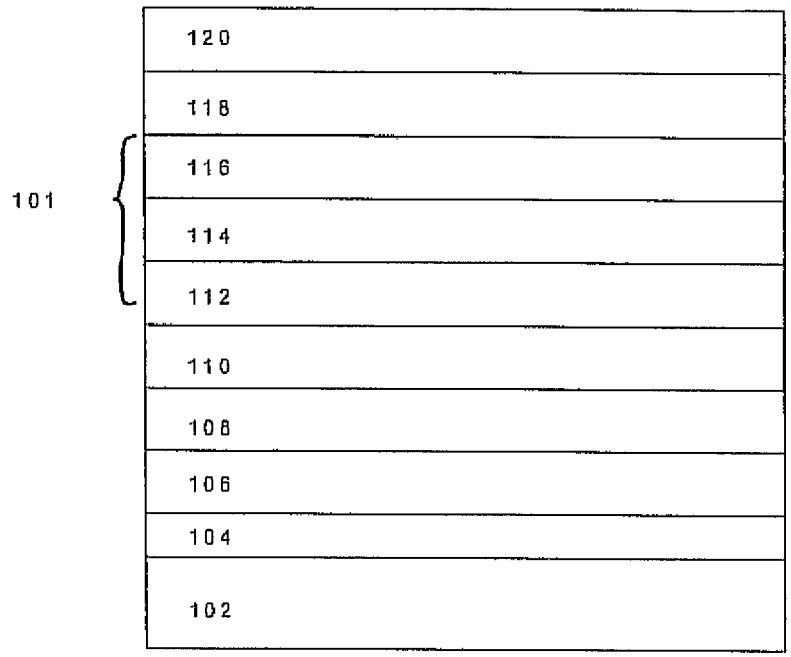
FIG. 1 is a cross-sectional view of a semiconductor quantum dots-in-well (DWELL) device in accordance with the present invention.

Turning now to FIG. 1, a cross-sectional view of an example DWELL structure 100 is illustrated. DWELL structure 100 includes multiple layers 104-120 fabricated on a substrate 102. The layers include a buffer region 104, an etch-stop region 106, a conductive region 108, a barrier region 110, an absorbing region 101, another barrier region 118 and another conducting region 120. In this example, the absorbing region 101 includes well regions 112 and 116 and quantum dot region 114 located between the two well regions 112 and 116.

FIG. 1 will be discussed in the context of a particular embodiment and is simplified for ease of discussion. Thus, it is not intended to be limiting. For example, other embodiments may use some, all or none of the specific regions shown in FIG. 1. The basic structure may be used with certain regions omitted and/or additional regions inserted. The regions are shown in FIG. 1 without lateral shape when, in fact, the lateral shapes of the regions may be different and the regions may or may not be overlapping. The composition of the regions and the number of layers within each region may vary from one design to the nest. In the example embodiment used to discuss FIG. 1, each region (other than the substrate) is implemented as a single layer of material for ease of discussion but this it not meant to be a limitation. Other variations will be apparent. For example, an alternate embodiment uses quantum dots made with $In_xGa_yAl_zAs$, quantum wells made with $In_xGa_yAl_zAs$ and barriers using a different composition of $In_xGa_yAl_zAs$.

In the example embodiment of FIG. 1, the substrate 102 is a Gallium Arsenide (GnAs) substrate. However, substrate 102 can include other materials, for example Indium Phosphide (InP), Indium Arsenide (InAs), Gallium Antimonide (GaSb), Cadmium Zinc Telluride (CdZnTe), Silicon (Si), and epitaxially grown materials (such as a ternary or quaternary semiconductor) to name a few, or the like. Substrate 102 typically is selected so that its lattice constant minimizes defects in materials subsequently grown thereon.

In FIG. 1, a buffer region 104 is positioned on substrate 102 and, in this example, is a GaAs layer in order to provide a smooth defect-free surface to minimize defects in materials subsequently grown thereon. Buffer region 104 can be formed in other semiconductor materials, including AlAs, AlGaAs, InGaAs, or combinations of materials. In many cases, the composition of the buffer region 104 is chosen to provide a lattice constant that may be different from the lattice constant of substrate 102 but that minimizes defects in materials subsequently grown thereon.

Etch-stop region 106 is positioned on buffer region 104. Etch-stop region 106 allows removal of substrate 102 and buffer region 104, by use of selective etching. Substrate 102 and buffer region 104 are readily removed by an etching technique whereas etch-stop region 106 is resistant to removal by the etching technique. Furthermore, etch-stop region 106 can itself be selectively removed from structural layers of the device using another suitable etching technique. Thus, etch-stop region 106 can be patterned, via conventional photolithography for example, and then lateral features etched into the exposed areas of buffer region 104 and/or substrate 102. The etch-stop region itself can also be patterned to form lateral features. In the example of FIG. 1, etch-stop region 106 is AlAs. However, other high etch selectivity materials can also be used, including but not limited to Indium Gallium Phosphide (InGaP) or other materials lattice matched to buffer region 104.

Conductive region 108 is positioned on etch-stop region 106. In the FIG. 1 example, conductive region 108 includes a highly doped semiconductor material with a conductivity type (e.g., n-type) to provide a lateral electrical contract for the device and also to facilitate current spreading. Ohmic metal contacts (not illustrated) can be made to conductive region 108 through standard semiconductor processing techniques.

A first barrier region 110 is positioned on conductive layer 108. The first barrier region 110 provides a barrier to electron motion for an absorbing region 101 subsequently grown thereon. In the example embodiment, first barrier region 110 is GaAs, when grown on a GaAs substrate. Other suitable barrier materials can also provide a conduction band offset, including but not limited to $Al_xGa_{1-x}Al$, where x may vary from 0% to 100%, and GaAsP, when grown on a GaAs substrate. Other materials are suitable for other substrate types.

An absorbing region 101 is then formed by sequential deposition of a first well region 112, a quantum-dot region 114 and a second well region 116. Absorbing region 101 is illustrated as consisting of a single set of regions 112, 114 and 116 for simplicity and ease of discussion, and is not intended to limit the scope of the invention. In a preferred embodiment, the absorbing region 101 can include many more regions than are shown in FIG. 1. For example, the basic structure defined by regions 112-116 can be repeated sequentially multiple times to form the absorbing region 101, with each iteration of the basic structure separated from the next by barrier regions. Each iteration of the basic structure may be different in design. For example, the composition and/or thickness could be changed to enhance spectral diversity or signal to noise ratio.

First well region 112 is formed using a material with a lower conduction band edge than barrier region 10. In the example embodiment, first well region 112 is $In_xGa_{1-x}As$, where x is approximately equal to 15%. However, other compositions and other suitable materials may be chosen, depending on the starting substrate and desired band offset.

Quantum dot region 114 is formed using a self-assembled arrangement of quantum dots that is lightly doped with Si to provide 1-2 electrons per dot. The doping is optional. In the design of FIG. 1, the composition of quantum dot region 114 is chosen such that a conduction band edge of quantum dot region 114 is less than that of both first well region 112 and second well region 116. In the example, quantum dot region 114 includes InAs dots, when grown on a GaAs substrate. Other dot materials can also be used. The choice of materials depends in part on the starting substrate and the desired band offset. The geometry of the dots and the density of the dots are controlled by growth conditions. In the example embodiment, the quantum dot region 114 is lightly doped to provide approximately one electron per quantum dot.

Second well region 116 is formed using a material with a lower conduction band edge than barrier region 110 and barrier region 118. In the FIG. 1 example, well region 116 is $In_yGa_{1-y}As$, where y is approximately equal to 15% but preferably has a different thickness than well region 112. Other compositions and other suitable materials may be chosen, depending in part on the starting substrate and desired band offset. The composition and/or thickness of second well region 116 preferably are chosen to be different from the composition and/or thickness of first well region 112. This introduces an asymmetry that leads to the spectrally tunable behavior of the detector.

Barrier region 118 is positioned on second well region 116. Barrier region 118 includes a material capable of providing a barrier to electron motion for absorbing region 101. In the FIG. 1 example, barrier region 118 consists of GaAs, when grown on a GaAs substrate, the same as barrier region 110. As with barrier region 110, other materials can provide a suitable conduction band offset, including but not limited to AlGaAs and GaAsP, when grown on a GaAs substrate.

Well regions 112 and 116, surrounded by barrier regions 110 and 118 provide a quantum well. Quantum dot region 114 sits in this quantum well. Absorbing region 101 combined with barrier region 110 provides a quantum potential system wherein the allowed states for electrons in the dots and wells are determined by the compositions and thicknesses of the wells and barriers, together with the composition and geometry of the dots.

A conductive region 120 is positioned on barrier region 118. In this example, conductive region 120 includes highly doped semiconductor material with the same conductivity type as conductive region 108 (e.g., n-type). Ohmic metal contacts (not illustrated) can be made to conductive region 129 using standard semiconductor processing techniques.

Structure 100 can be fabricated using conventional means. In a preferred approach, regions 104, 106, 108, etc., are deposited using Molecular Beam Epitaxy, Metalorganic Chemical Vapor Deposition, or similar conventional techniques. The conditions used to grow quantum dot region 114 can be used to vary the size, shape and density of the quantum dots using well-known principles. Using conventional techniques, large number of individual devices and/or arrays of devices can be simultaneously fabricated on a substrate 102.

Operation of the example device in FIG. 1 will be explained with reference to FIG. 2. To operate the device, a bias voltage is applied to the device across contacts formed on conductive contact regions 108 and 120. Light is incident on the device, either through a top surface (e.g., conductive region 120) or through a bottom surface. The bottom surface can be substrate region 102, or conductive region 108. In some embodiments, it is preferable to remove or thin substrate region 102 and etch-stop region 104 by semiconductor processing techniques, in order to increase the illumination of absorbing region 101. Light absorbed in absorbing region 101 contributes to an electric current that determines an absorption spectrum of DWELL structure 100.

Figure 2:
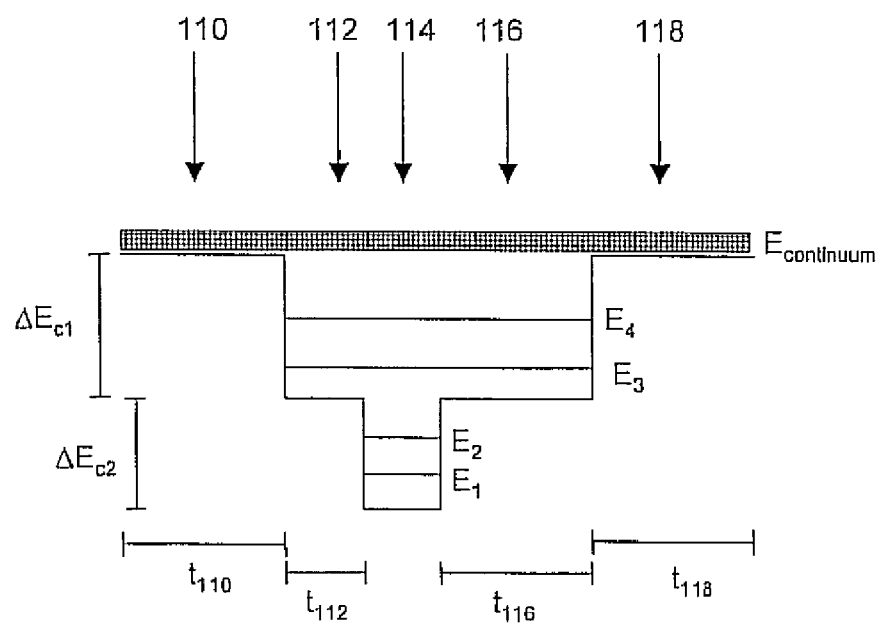
FIG. 2 is a band diagram showing a conduction band energy alignment of the absorbing region of FIG. 1.

Turning now to FIG. 2, FIG. 2 shows a conduction band energy alignment of a DWELL absorbing region 101. Energy levels are determined by the band alignment and layer thicknesses of the quantum confinement absorbing region.

Continuing the example of FIG. 1, first barrier region 110 and barrier region 118 define bulk electron barrier regions. In this example, the thickness of regions 110 and 118, t.sub.110 and t.sub.118, respectively, are chosen to be of the order of several tens of nanometers. The barrier regions are GaAs and the level of the conduction band of barrier regions 110 and 118 are identical. However, in other designs, the conduction band level of regions 110 and 118 can be different.

First and second well regions 112 and 116, which have thickness $t_{112}$ and $t_{116}$, respectively, define a quantum well between barrier regions 110 and 1118, with a conduction band discontinuity, $\Delta E_{e1}$ with respect to barrier regions 110 and 118. In the FIG. 1 design, thicknesses $t_{112}$ and $t_{116}$ are of the order of several nanometers and are chosen to have different values. The different thicknesses introduce a physical asymmetry in the absorbing region 101. In this example design, the compositions of well regions 112 and 116 are chosen to be identical, providing the same conduction band level. However, in other designs, the conduction band level of regions 112 and 116 can be different.

The thickness and composition of regions 110 and 118, together with the thicknesses and compositions of first and second well regions 112 and 116, and the composition and geometry of quantum dot region 114, provide a quantum confining potential system that defines a set of allowed energy levels for electrons in the absorbing region 101. Quantum dot region 114 is illustrated having a conduction band discontinuity, $\Delta E_{e2}$ with respect to well regions 112 and 116. A quantum dot in quantum dot region 114 is illustrated as having a fixed width for ease of discussion only, and does not necessarily reflect the shape of the dot. However, such an approximation can be used to discuss the physical principles of the design, without loss of validity, and the discussion can be extended to the full geometry of a quantum dot.

By way of example only, two allowed energy states in the quantum dot region ($E_1$ and $E_2$) and two allowed energy states in the well region ($E_3$ and $E_4$), together with a schematics: of a continuum of energy states above the well ($E_{continuum}$) are illustrated. The actual number of; energy states and the exact energy levels of the energy states will be determined by the quantum confinement structure.

Transitions can occur between the different allowed states including, but not limited to dot-to-well state transitions, dot-to-continuum states unconfined by the well, as well as dot-to-dot states, well-to-continuum states and the like. These transitions contribute to an absorption spectrum of the DWELL device 100 that can extend to include wavelengths from MWIR to VLWIR wavelengths, and further, the spectrum depends on the applied bias voltage and is therefore electrically tunable. Photogenerated carriers are swept out under the influence of an applied field across the absorbing region. The device is an n-i-n device. The device structure is asymmetric due to the use of different thicknesses and/or compositions of well regions, as well as an asymmetry afforded by the growth direction of quantum dots, which typically have a larger base than tip. Asymmetric behavior of the device is tailored through design of the well regions.

Under the influence of a bias, effects including, but not limited to, band bending occur according to a direction of an applied field. The strength of an applied field can be used to modify the positions of confined energy levels through effects including, but not limited to, the quantum confined stark effect (QCSE), as well as controlling strength of different transitions between levels.

Figure 3A:
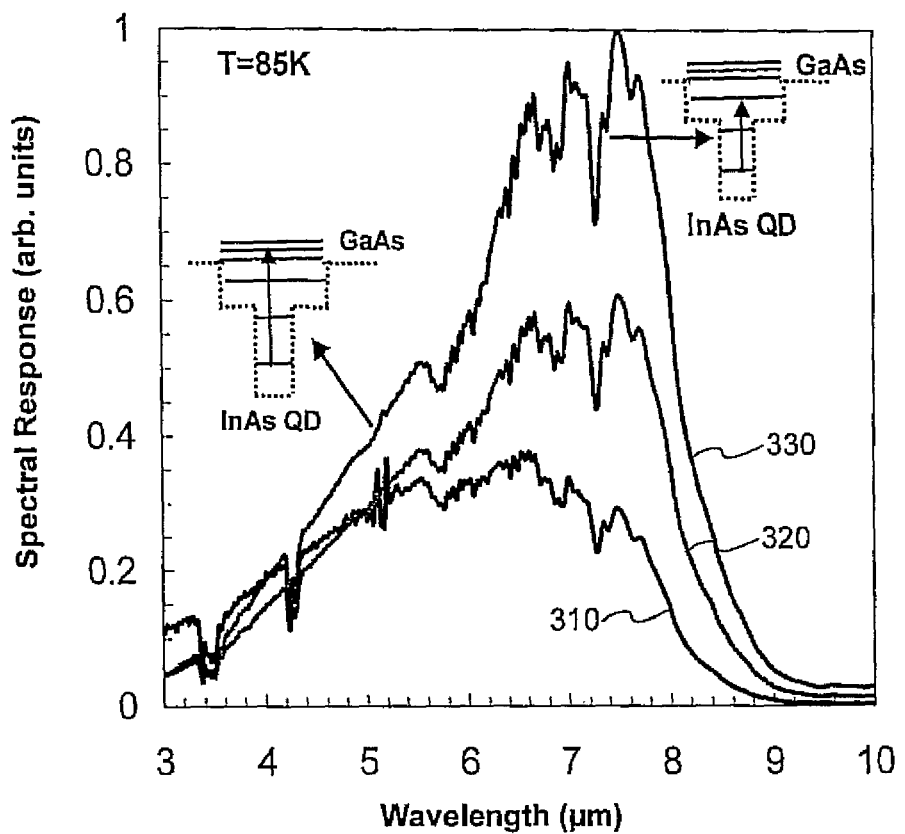
FIG. 3A is a graph of the spectral response of an example semiconductor device at different bias voltages.

FIG. 3A shows the absorption spectra (measured at 85K) of a DWELL device at different bias voltages. Curve 310 shows the spectral response at −0.3V, curve 320 at −0.6V, and curve 330 at −0.9V. In this specific device, the barrier regions 110 and 118 are GaAs and have thickness 50 nm. First well region 112 and second well region 116 are In.sub.0.15Ga.sub.0.85As with thicknesses of 10 .ANG. and 60 .ANG., respectively. Quantum dot region 114 consists of a 2.4 monolayer deposition of InAs, grown at 480.degree. C., that forms an array of self-assembled quantum dots. The absorbing region consists of 10 stacks of the basic absorbing unit. The peak of the response is approximately at 7.2 μm (170 meV) with a spectral width ($\Delta\lambda/\lambda$) of approximately 35% ($\Delta\lambda$=2.5 μm). Longer wavelength peaks, typically 7-12 μm, are attributed to dot-to-well transitions. Shorter wavelength peaks, typically 2-7 μm, are attributable transitions including dot-to-continuum transitions. Dot-to-dot transitions cause absorption in a wavelength range approximately 20-30 μm.

A broad response is a desirable feature for LWIR detectors as they provide a wide spectral coverage in a single detector. It should be noted that the patterns on the spectra reflect atmospheric absorption over this wavelength range. The shape and position of the absorption spectra depend on the applied bias voltage. The long-wavelength cut-off of the detector response displays a shift to longer wavelength, also known as a red-shift at increased bias voltage magnitudes, due to band-bending effects and the like.

Figure 3B:
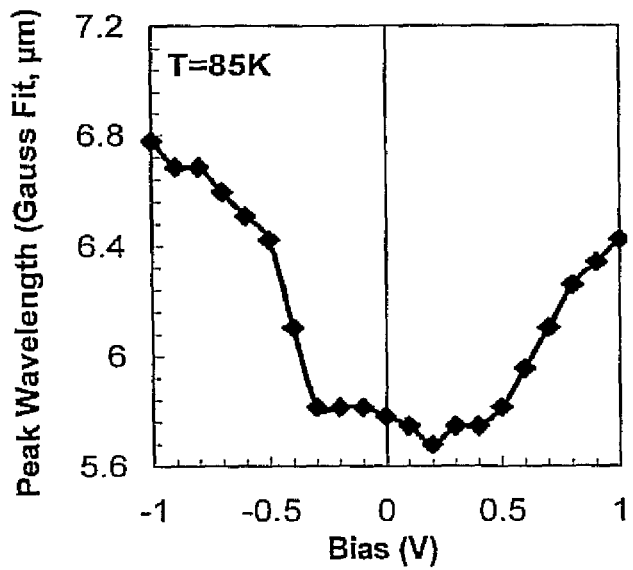
FIG. 3B is a graph of peak wavelength as a function of bias voltage for the semiconductor device of FIG. 3A.

In FIG. 3B, the absorption spectrum at different bias voltages is fit by a Gaussian shape and FIG. 3B graphs the peak wavelength as a function of the applied bias. A definite dependence of the peak wavelength on the operating bias is shown.

The thickness and composition of well regions 112 and 116, and the surrounding barrier regions 110 and 118, together with the composition and geometry of quantum dot region 114 determine the operating wavelength range of a DWELL detector. Variations in thickness, compositions, and geometries of region can be used alone, or in combination to tune the spectral response over the MWIR/LWIR regime. For a specific detector, further tuning can be accomplished by varying a bias of the detector.

Figure 4:
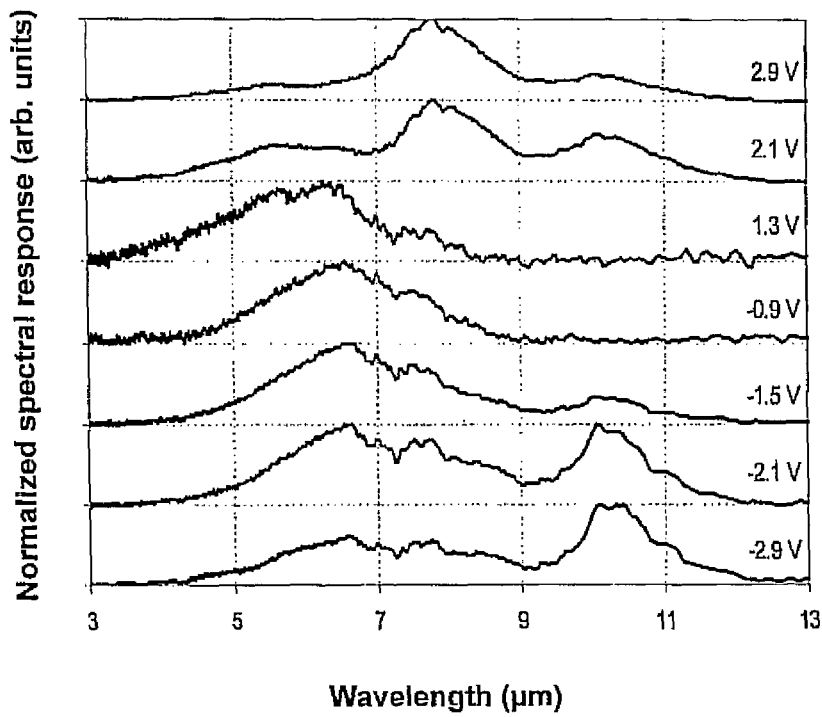
FIG. 4 is a graph of the spectral response of another example semiconductor device at different bias voltages.

FIG. 4 is a graph of the spectral response of another example semiconductor device at different bias voltages. In this specific device, the barrier regions 110 and 118 are GaAs and have thickness 50 nm. First well region 112 and second well region 116 are $In_{0.15}Ga_{0.85}As$ with thicknesses of 50 Å and 60 Å, respectively. Quantum dot region 114 consists of a 2.4 monolayer deposition of InAs that forms an array of self-assembled quantum dots. The absorbing region consists of 15 stacks of the basic absorbing unit. In FIG. 4, each spectral curve is vertically offset from the others so the shape of the curve can be more clearly seen.

FIGS. 1-4 described some examples of detectors with tunable spectral response. Other designs will be apparent. For example, structures that cause asymmetry in the local potential seen by carriers in the absorbing region typically will have a tunable spectral response. In the examples given above, the asymmetry was the result of an asymmetric dot-in-well structure, but it could be achieved by other means. For example, other quantum confined structures can be used, including but not limited to quantum wells, quantum dots, quantum wires, quantum dashes and superlattices. Other materials can also be used, even with the specific design of the DWELL structure. For example, a DWELL structure could be based on InAs dots, In$_x$Ga$_y$As wells and Ga$_y$Al$_z$As barriers. Another material combination is In$_x$Ga$_y$Al$_z$As dots, In$_x$Ga$_y$Al$_z$As wells and In$_x$Ga$_y$Al$_z$As barriers. Alternately, spectral tunability may be introduced by introducing defects or dopants (such as p- and n-type dopants) on one or both sides of a heterostructure. The detector need not be based on intersubband transitions.

Figure 16:
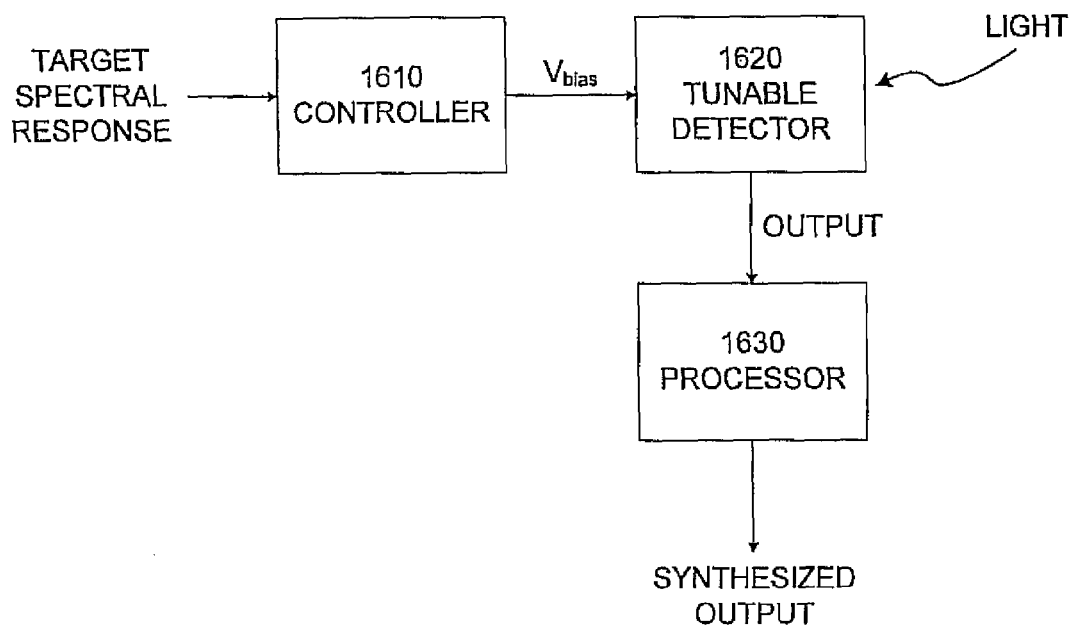
FIG. 16 is a block diagram of a system using a spectrally tunable detector according to the invention.

A spectrally tunable detector can be used in a number of ways. FIG. 16 shows one example system. In this system, a controller 1610 provides the bias voltage to the spectrally tunable detector 1620, the output of which is analyzed by a processor 1630. In one approach, a single bias voltage is selected for the detector 1620 and it is operated as a detector with a fixed spectral response. Even in this case, the spectral tunability may be advantageous because the spectral response can be changed for different applications. Thus, a single part may be used in many different applications, increasing the overall volume and reducing the cost of the part. In another approach, the detector 1620 may be cycled through different spectral responses, for example first acting as a MWIR detector and then as a LWIR detector. The time multiplexing allows a single detector 1620 to replace two detectors.

In another approach, a spectral response for the system can be synthesized by cycling the detector 1620 through different spectral responses. The outputs are combined by the processor 1630 to synthesize an overall "effective" spectral response, which may not attainable at any one bias voltage. For example, the spectral response may peak at wavelength λ1 at bias voltage V1 and at wavelength λ2 at bias voltage V2. Adding the two responses may produce an effective spectral response that peaks somewhere between λ1 and λ2. It is even possible to effectively narrow the spectral response of the detector. Different broadband spectral responses can be combined in such a way that the overall response is spectrally narrower.

Alternately, the system can be used as a type of matched filter. The controller 1610 cycles the detector 1620 through a set of bias voltages. The corresponding outputs form a "signature." The processor can match the acquired signature against known signatures, for example if looking for a particular object or material.

FIGS. 5-12 describe some examples of how spectral responses at different bias voltages can be combined to synthesize a target spectral response. The QDIP detector described above will be used to illustrate these approaches, but they are not limited to QDIP detectors. They are equally applicable to any detector where the spectral response of the detector can somehow be varied (including by means other than changing an applied bias voltage). In one embodiment, a two-step algorithm consisting of a projection step and a reconstruction step is used to achieve a desired spectral response.

Figure 5:
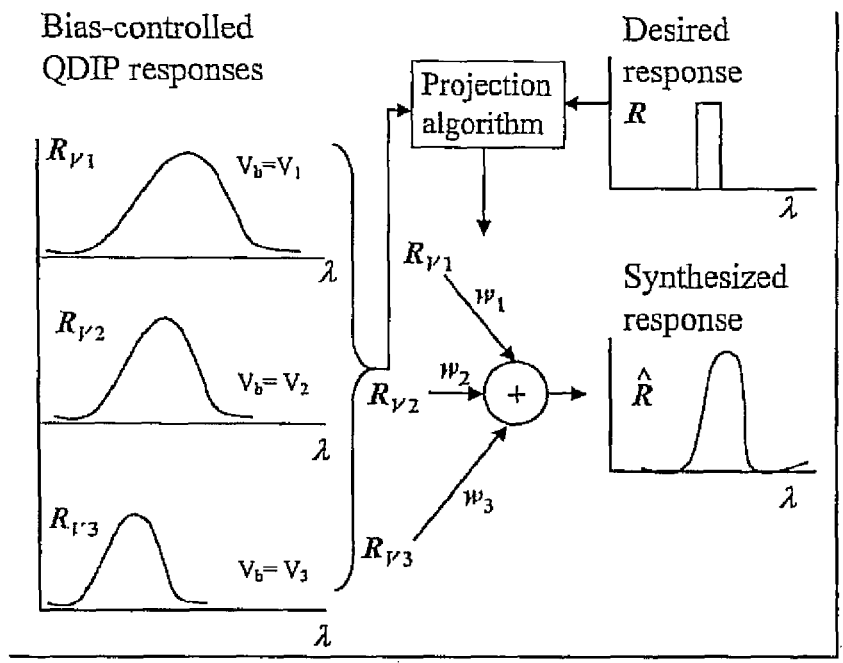
FIG. 5 is a schematic illustrating a projection step used to approximate a target spectral response by forming a linear combination of spectral responses at different bias voltages.

FIG. 5 is a schematic of a projection step. The desired spectral response R, as a function of the wavelength λ, is to be approximated by forming an optimal linear superposition of the different basis spectral responses $R_{Vn}$, which are the spectral responses of the detector at pre-selected bias voltages $V_n$. The projection step determines the weights $w_n$ applied to each of the spectral responses $R_{Vn}$.

Figure 6:
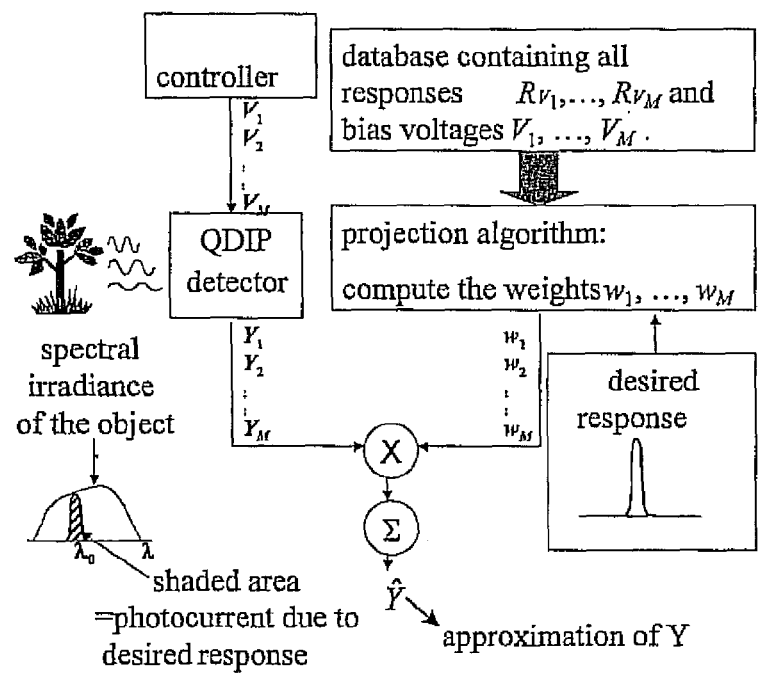
FIG. 6 is a schematic illustrating a reconstruction step, combining bias-dependent output from a spectrally tunable detector to simulate a target spectral response.

FIG. 6 is a schematic of a reconstruction algorithm. Measurements $Y_n$ are obtained from the spectrally tunable detector at each of the bias voltages $V_n$. These are combined so that the effective overall response approximates the desired spectral response R. In particular, the measurements $Y_n$ are weighted by the weights $w_n$ calculated in the projection step, and then summed to obtain a response that approximates detection by the desired spectral response R.

The following is a mathematical explanation of one implementation of the projection and reconstruction processes. Let $R_V(\lambda)$ denote the spectral response of a tunable detector when the detector is biased by V volts and suppose that the spectrum $R_V(\lambda)$ has been measured a priori for M voltages, $V_1, \ldots, V_M$. Now let $R_V(\lambda)$ denote the desired spectral response, which is assumed to be in the range $\lambda_{min}$ to $\lambda_{max}$. Suppose that M measurements, $Y_1, \ldots, Y_M$, of a radiating object are collected using the detector, where $Y_1$ is obtained at an applied bias $V_1$. The goal of the processing algorithm is to seek a set of weights $w_1, \ldots, w_M$, depending of R, so that the superposition response $$\hat{Y} = \sum_{i=1}^{M} w_i Y_i, \tag{1}$$

"best" approximates the response Y, which is the response that would have been measured had the detector possessed the desired spectral response $R(\lambda)$. This implementation defines "best" in the sense of minimizing the mean-square error $|\hat{Y}-Y|^2$. However, other metrics for error (e.g., other definitions of "best") can be used in other implementations. The projection step seeks the set of weights, written in vector form as $$w = [w_1, \ldots, w_m]^1, \tag{2}$$

which minimizes the error $|\hat{Y}-Y|^2$. A solution to this minimization problem can be equivalently obtained by determining the set of weights that minimizes the integrated mean-square error $$\varepsilon(R; M) = \int_{\lambda_{min}}^{\lambda_{max}} \left| \sum_{i=1}^{M} w_i R_{V_i}(\lambda) - R(\lambda) \right|^2 d\lambda, \tag{3}$$

which is associated with approximating the desired spectral response R(.lambda.) by $$\hat{R}(\lambda) = \sum_{i=1}^{M} w_i R_i(\lambda). \tag{4}$$

This assertion can be justified as follows: First note that the measurement Y is proportional to the integral $$\int_{\lambda_{min}}^{\lambda_{max}} G(\lambda) R(\lambda) \, d\lambda,$$

where $G(\lambda)$ is the spectral radiance at the detector's active surface. Now the error $|\hat{Y}-Y|^2$ can be cast as $$|\hat{Y} - Y|^2 = \left| \int_{\lambda_{min}}^{\lambda_{max}} G(\lambda) \left\{ R(\lambda) - \sum_{i=1}^{M} w_i R_{V_i}(\lambda) \right\} d\lambda \right|^2 \leq \left[ \int_{\lambda_{min}}^{\lambda_{max}} |G(\lambda)| \left\{ R(\lambda) - \sum_{i=1}^{M} w_i R_{V_i}(\lambda) \right\} | d\lambda \right]^2.$$

The last integral can be further upper bounded using Schwarz's inequality so that $$|\hat{Y}-Y|^2 \leq \left\{\int_{\lambda_{min}}^{\lambda_{max}} G^2(\lambda)\,d\lambda\right\}\left\{\int_{\lambda_{min}}^{\lambda_{max}}\left[R(\lambda)-\sum_{i=1}^{M}w_i R_i(\lambda)\right]^2 d\lambda\right\}. \quad (5)$$

Considering (without loss of generality) a normalized irradiance function G so that the first integral is unity, then minimizing the maximum of $|\hat{Y}-Y|^2$, over all possible normalized radiance functions G, amounts to minimizing the second integral in Equation (5), which proves the assertion leading to the integral in Equation (3). The requirement to minimize the maximum (over all possible normalized radiance functions G) of the error $|\hat{Y}-Y|^2$ is reasonable since the choice of the weights should not depend on the unknown irradiance function G and the approximation should be accurate uniformly in G. If there is some knowledge of the distribution of G in a particular application, this can be used to improve the performance. Finally, the integrated error given in Equation (3) can be discretized and the weight vector, w, can be analytically determined using standard quadratic minimization techniques. The details of computing the vector, w, (comprising the projection step) in a preferred embodiment are detailed separately.

Note that in the spectral approximation shown in Equation (4), the shape, width, and center wavelength of R is arbitrary. Thus, this processing technique can be designed to tune the synthesized response to an arbitrary center wavelength and spectral width. To obtain good results, the approximation error between the ideal responsivity $R(\lambda)$ and its approximation $\hat{R}(\lambda)$ should be small. Thus, the choice of the desired spectral width and the center wavelength should be compatible with the range of the wavelengths covered by the ensemble of bias-dependent spectral responses.

Initially, in the above projection-based development of the approximate spectral response $\hat{R}(\lambda)$, no smoothness constraint was imposed on $\hat{R}(\lambda)$. In practical situations, however, the resulting $\hat{R}(\lambda)$ may be undesirably rough, despite the fact that it achieves the minimum mean-square error. This roughness may be caused by the high-frequency content of the bias-dependent spectra themselves, which is due to the sharp transitions in the spectra at the atmospheric-absorption bands. It can also result from requiring stringent FWHM and tuning requirements, which would result in the significant amplification of certain segments of the spectra that may contain a high level of fluctuation. To remedy this problem, a smoothness criterion can be built into the minimization (over w) of the error given by Equation (3). This will bring smoothness to $\hat{R}(\lambda)$ at the tolerable expense of reduced spectral resolution. In one approach, consider the regularized mean-square error $$\varepsilon(R; M; \alpha) = \int_{\lambda_{min}}^{\lambda_{max}}\left\{\left|\sum_{i=1}^{M}w_i R_{V_i}(\lambda)-R(\lambda)\right|^2 + \alpha\left[\frac{d^2}{d\lambda^2}\sum_{i=1}^{M}w_i R_{V_i}(\lambda)\right]^2\right\}d\lambda, \quad (6)$$

where the Laplacian operator, $$\frac{d^2}{d\lambda^2},$$

is used to measure roughness in the approximation. The regularization parameter, $\alpha \geq 0$, controls the amount of penalization imposed on the roughness. Its specific value is typically chosen according to empirical results. In our measurements, the value $\alpha=0.04$ gave good results. As before, the above regularized error can be discretized and the weight vector w can be solved for analytically. The details of the calculation of the weight vector w (which minimizes the regularized error in Equation (6)) are considered next.

The following is one approach to determine the weight vector w. Upon discretizing (in the variable $\lambda$) the integral in Equation (6), the integrated mean-square error can be approximated by the discrete sum.

$$\varepsilon(R; M, \alpha) \approx \Delta\lambda L^{-1}\sum_{k=1}^{L}\left[\begin{array}{c}R(\lambda_k)-\\ \sum_{i=1}^{M}w_i R_i(\lambda_k)\end{array}\right]^2 + \alpha\left[\begin{array}{c}\sum_{i=1}^{M}w_i(-R_i(\lambda_{k-1})+\\ 2R_i(\lambda_k)-R_i(\lambda_{k+1}))\end{array}\right]^2, \quad (7)$$

where $$\Delta\lambda = \lambda_{max}-\lambda_{min},\; =\lambda_{min},\ldots,\lambda_L=\lambda_{max},\lambda_{k+1}-\lambda_k=\frac{\Delta\lambda}{L},$$

and L is the mesh size (total wavebins) used in approximating the integral. Define the vector $R=[R(\lambda_1)\ldots R(\lambda_L)]^T$ and form the matrix $$A = \begin{bmatrix} R_{V_1}(\lambda_1) & R_{V_2}(\lambda_1) & \cdots & R_{V_M}(\lambda_1) \\ R_{V_1}(\lambda_2) & R_{V_2}(\lambda_2) & \cdots & R_{V_M}(\lambda_2) \\ \vdots & \vdots & \vdots & \vdots \\ R_{V_1}(\lambda_L) & R_{V_2}(\lambda_L) & \cdots & R_{V_M}(\lambda_L) \end{bmatrix} \quad (8)$$

then the integrated error in Equation (6) can be recast in matrix form as $$\varepsilon(R;M,\alpha) \cong \Delta\lambda L^{-1}[\|R-Aw\|^2+\alpha\|QAw\|^2]_x \quad (9)$$

where Q is the Laplacian operator matrix corresponding to the weighting operation in Equation (6) and the symbol $\|x\|$ represents the Euclidean norm of a vector x. Note that other operators may also be used in other embodiments. In this embodiment, Q is an L-by-L matrix where each entry on the main diagonal is "2" and the $1^{st}$ sub-diagonal and super-diagonals entries are "-1." From basic quadratic minimization principles, the weight vector w can be found using the following formula, which actually gives the projection of the spectrum R onto the finite-dimensional function space spanned by the basis set of spectra $R_1,\ldots R_M$:

$$w=(A^TA+\alpha A^T Q^T QA)^{-1}A^T R, \quad (10)$$

where the superscript "T" denotes the matrix transpose operator. Thus, the desired superposition of measurements, shown in Equation (1), can now be computed using the weight coefficient provided w (as schematically shown in FIG. 6).

In one embodiment, the reconstruction is performed based on a weight vector w that is determined using a regularization parameter $\alpha=0.04$, as this value appeared to give the best results. If too large an $\alpha$-parameter is used, then the reconstruction loses resolution, since the penalty on fluctuations are increased—see Equation (9). If too small a value for a is used, then the reconstruction becomes noisy, which results in noisy FWHM measurement, shift of the peak due to the noise, and therefore the possibility for a poor and erroneous reconstruction. By itself, penalizing the noise is not necessarily enough and a median filter is typically used to smoothen the reconstructed algorithm in order to be able to find and measure FWHM consistently. In this particular embodiment, the median-filtered spectral response is not, however, used in the reconstruction of $\hat{Y}$ in Equation (1). The filtering is used to obtain an accurate estimate of the yielded FWHM. In bias-dependent response measurements (between 3-11 μm) using 1257 data points, the length of the median filter was chosen to be 50 (.about.4% of the mesh size), which provided good results in terms of the measuring the FWHM.

Other manifestations of roughness/noise penalization and filter shapes, such as a Gaussian shape (instead of a triangular shape, for example) can be used in order to generate possibly better approximations in a projection step, which may be exploited and optimized to further improve an overall performance of an algorithm.

Figure 7A:
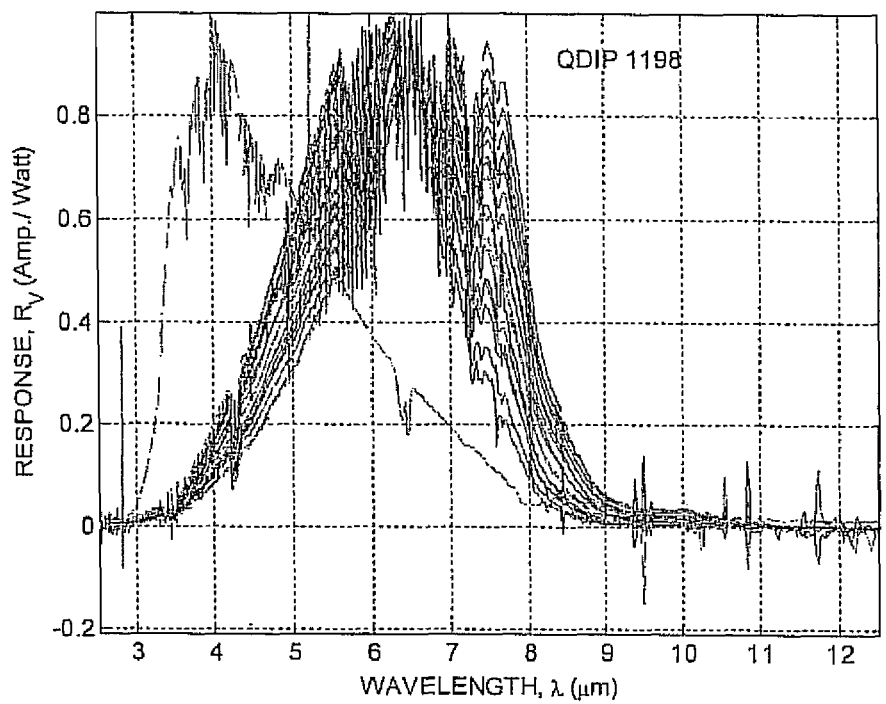
FIGS. 7A-7B are graphs of a basis set of spectral responses for two quantum dot infrared photodetectors (labeled QDIP1198 and QDIP1199), formed in accordance with the present invention.
Figure 7B:
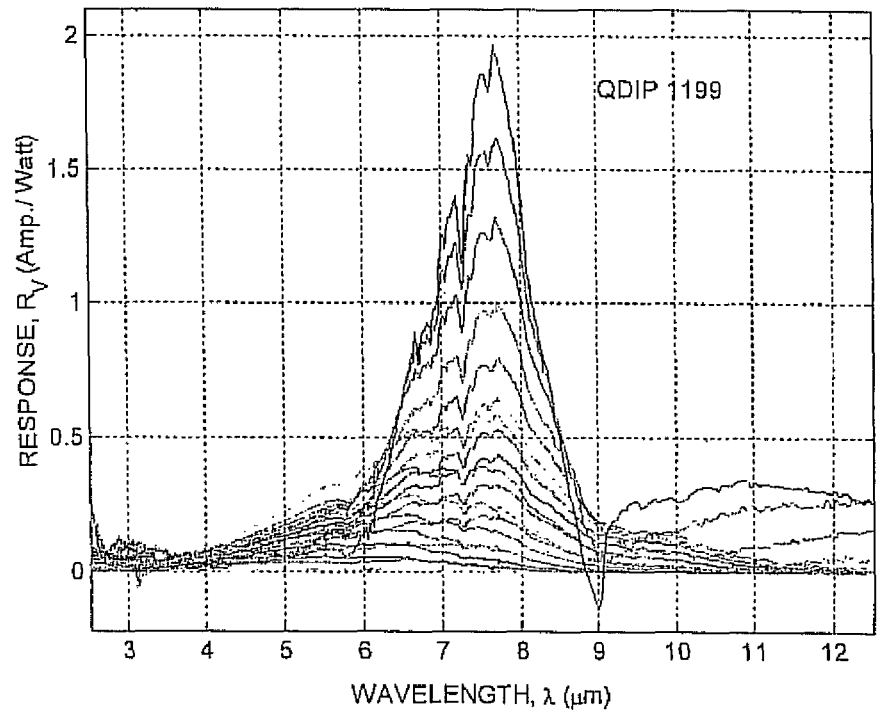

FIGS. 7A-7B are graphs showing a basis set of spectral responses of two quantum dot infrared photodetectors (labeled QDIP1198 and QDIP1199), respectively. Each basis response is the spectral response of the QDIP at a different bias voltage. The two devices have slightly different responses. The numbers in the legends correspond to the applied bias voltages (Volts) of the detectors. These basis spectral responses were measured and subsequently used in the processing technique described above to generate synthesized spectral responses with varying FWHMs and center wavelengths, as described with respect to FIGS. 8-13.

Figures 8, 11:
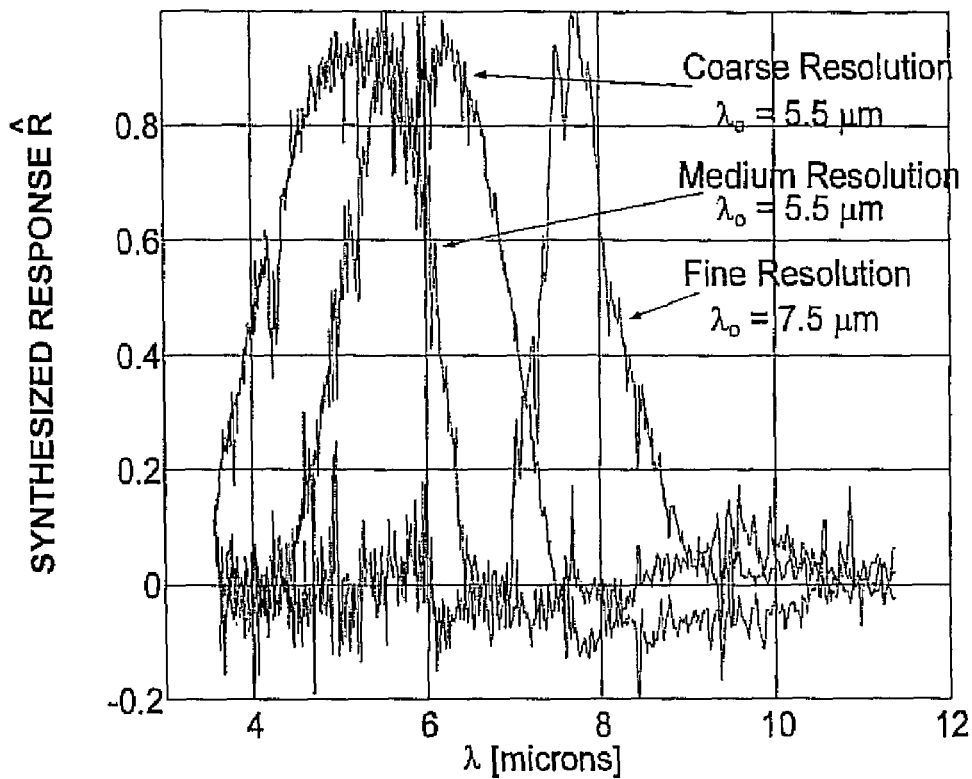
FIG. 8 are graphs showing three synthesized spectral responses for the QDIPs of FIG. 7.
FIG. 11 is a table defining three different spectral sensors.

FIG. 8 shows three examples synthesized spectral responses for QDIP 1198; a narrow response (0.5 μm width) centered at 7.5 μm, a medium width response (1.0 μm width) centered at 5.5 μm, and a course response (3.0 μm width) centered at 5.5 μm. Note that not only can different width responses be synthesized, but different center wavelengths can also be accommodated. In synthesizing the spectral response for QDIP1198, twenty biases were used (M=20) for which $[V_1, \ldots V_{20}]=[-1, -0.9, \ldots -0.1, 0.1, \ldots, 0.9, 1]$V. For QDIP 1199, M=21 and $[V_1, \ldots V_{21}]=[-1, -0.9, \ldots 0, \ldots, 0.9, 1]$ V. Other bias voltages and basis sets of spectral responses may be used in other embodiments.

Figure 9A:
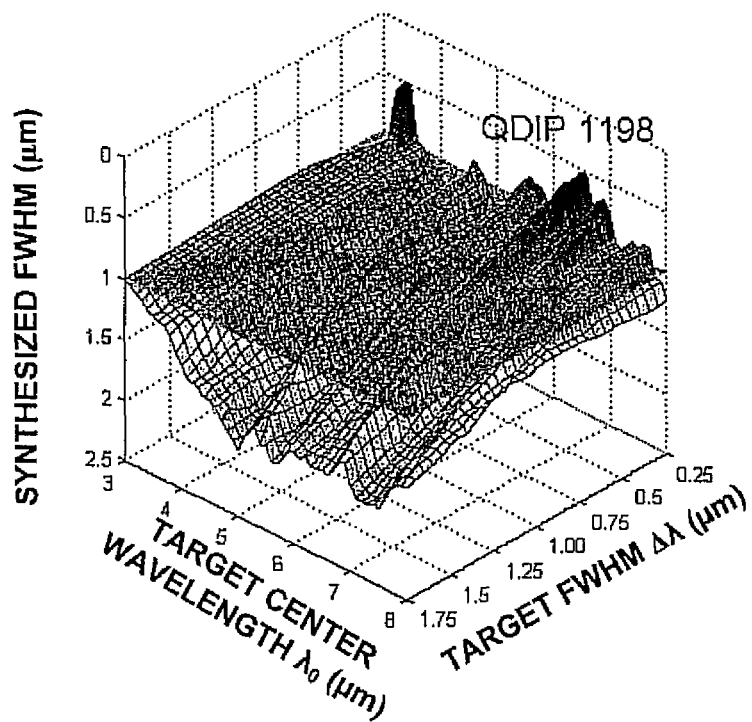
FIGS. 9A-9B are graphs showing the synthesized spectral resolution (full width half maximum of FWHM) as a function of the target center wavelength and target spectral bandwidth (FWHM) for QDIP 1198 and QDIP 1199.
Figure 9B:
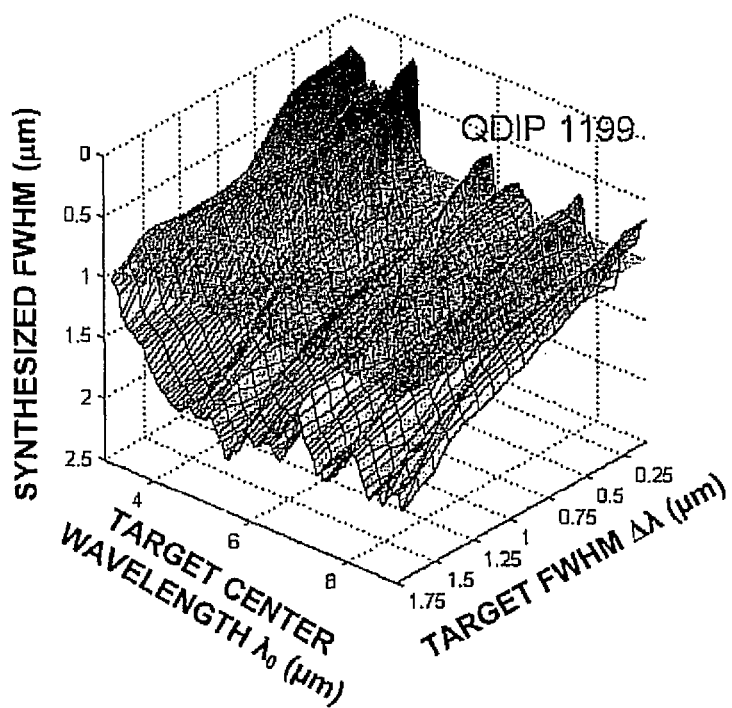

FIGS. 9A-9B are graphs showing the synthesized spectral resolution (FWHM), as a function of the target center wavelength and target spectral bandwidth (FWHM) for QDIP 1198 and QDIP 1199. These graphs show the variation in the spectral resolution (viz., full-width at half maximum ("FWHM")) rendered by the processing algorithm as the target center wavelength ($\lambda_o$) and the target FWHM are changed for the two different QDIPs. Note that the vertical axis is inverted, so the highest spectral resolution (lowest line width) is at the top. For each selection of, the center wavelength and desired FWHM, the shape of the target response is taken as a triangular function, whose base is twice as wide as the desired FWHM. Filter shapes, other than the triangular one, may also be used. The transparent planes in the figures represent spectral resolution of 1 μm, which is significantly smaller than the FWHM associated with the QDIPs' spectral response, which is typically in excess of 2 μm. Note that the synthesized FWHM can be continuously tuned over a wide range by varying the target FWHM.

Figure 10A:
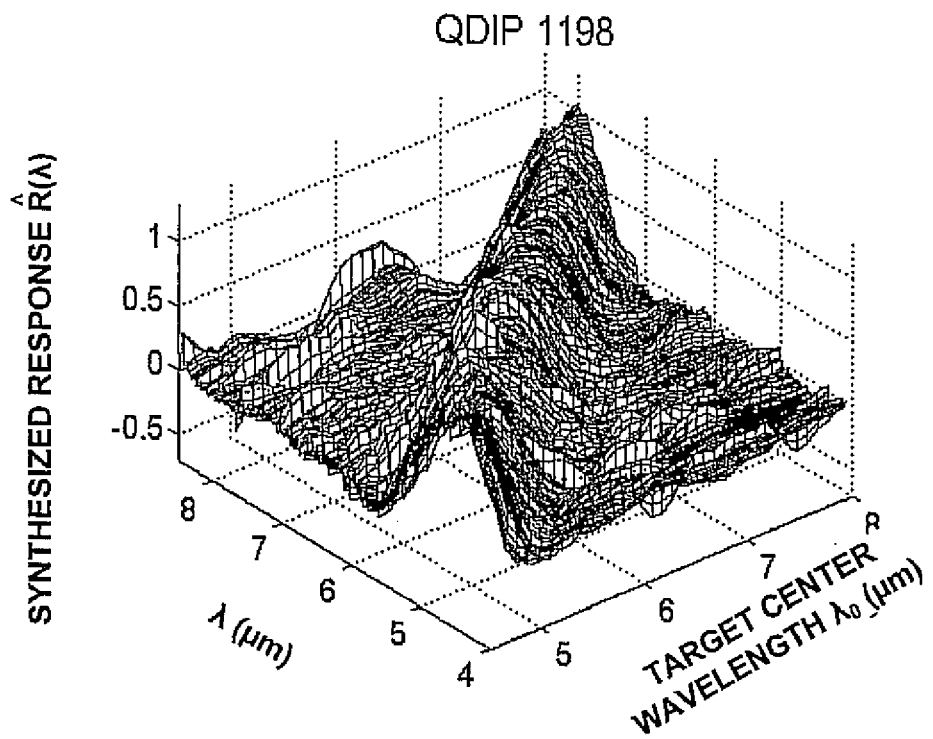
FIGS. 10A-10B are graphs showing synthesized spectral responses as a function of the target center wavelength at a fixed target spectral bandwidth (FWHM) of 0.5 .mu.m for QDIP 1198 and QDIP 1199.
Figure 10B:
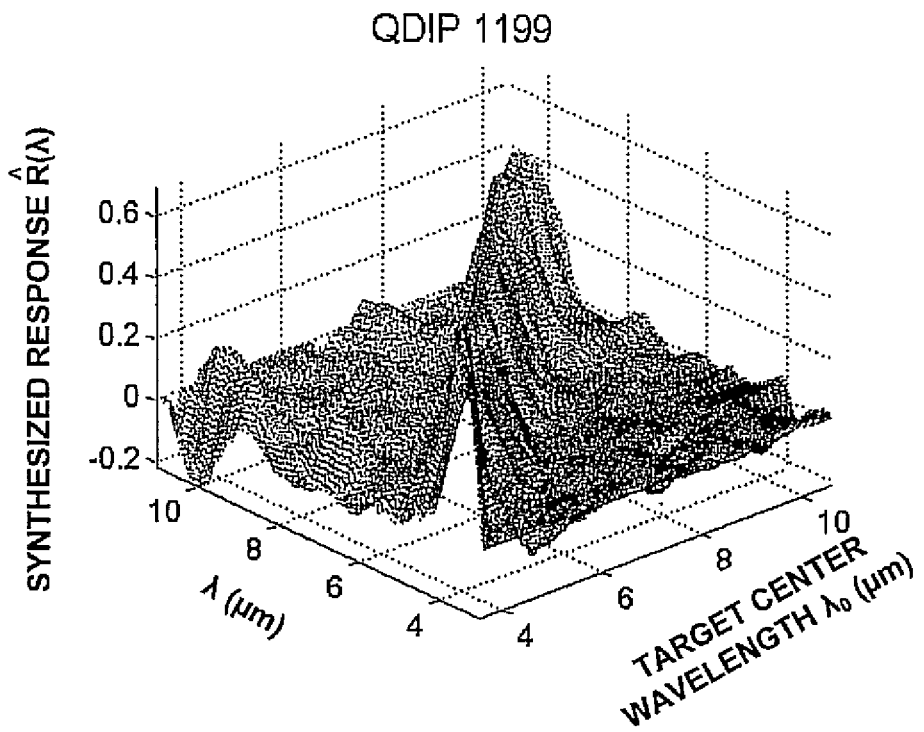

FIGS. 10A-10B are graphs showing synthesized spectral responses as a function of the target center wavelength at a fixed target spectral bandwidth (FWHM) of 0.5 μm for QDIP 1198 and QDIP 1199. These graphs show that a synthesized spectral resolution on the order of 0.5 μm can be obtained continuously across the wavelength range of 3-8 μm for both detectors. Also, the spectral resolution can be tuned from 0.5 μm to over 3.0 μm regardless of center wavelength. FWHM values less than 0.5 μm can be achieved by further tailoring the spectral response of the QDIP by modifying its design, or through modifications to the algorithm, or through both of these modifications together.

FIGS. 11-15 illustrate the results where QDIP devices were used to synthesize three different spectral sensing modes: a hyperspectral sensor, a 7-band multispectral sensor, and a 3-band multispectral sensor. The parameters of each of the spectral sensing modes are presented in FIG. 11 including the number of spectral bands and the target center wavelength and spectral resolution of each band. For each spectral sensing mode, the parameters in FIG. 11 were supplied to the processing algorithm described above. The weights required to synthesize each spectral band were computed based on the basis set of spectral responses for the QDIPs.

The accuracy of the synthesized bands was tested experimentally by measuring the spectrum of a blackbody radiation source and also the transmission spectrum of a 76.2-μm thick polystyrene sheet irradiated by a blackbody radiation source. These same spectra were measured-using a Nicoret FIR spectrometer with 4 $cm^{-1}$ spectral resolution in the wavelength range 2.5-20 μm.

FIGS. 12-13 show the results for emulation of the hyperspectral case (i.e., 200 spectral bands). FIG. 12 corresponds to the blackbody radiation source and FIG. 13 to the polystyrene sheet. In both figures, the A and B figures correspond to synthesis using triangular filters with a target FWHM of 0.5 μm and 0.25 μm, respectively. In all figures, the solid line is the spectra measured by the Nicolet spectrometer and the series of 200 dots is the spectra predicted by the "synthetic" sensor based on the QDIPs.

Figure 12A:
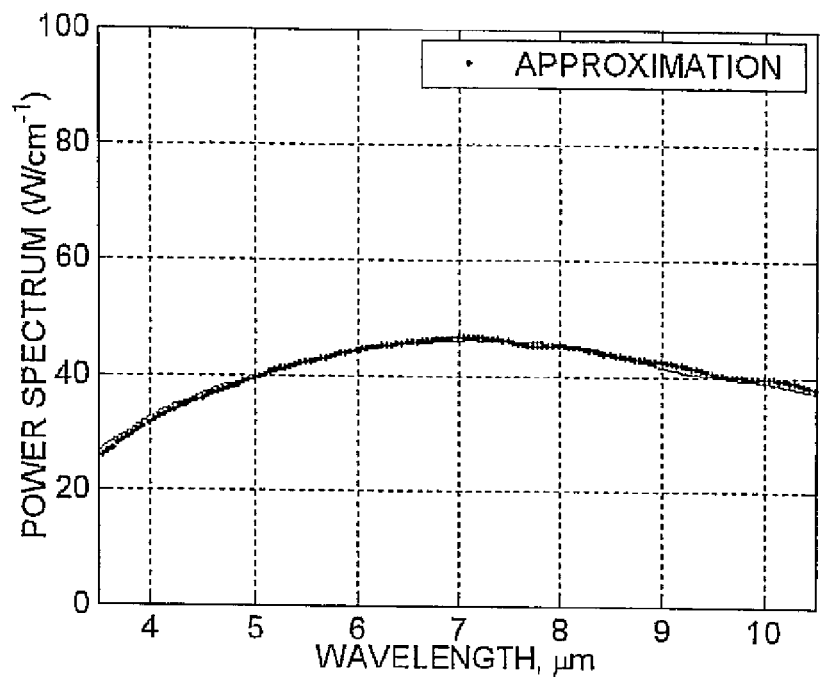
FIGS. 12A-12B are graphs showing hyperspectral reconstruction of a blackbody spectrum.
Figure 12B:
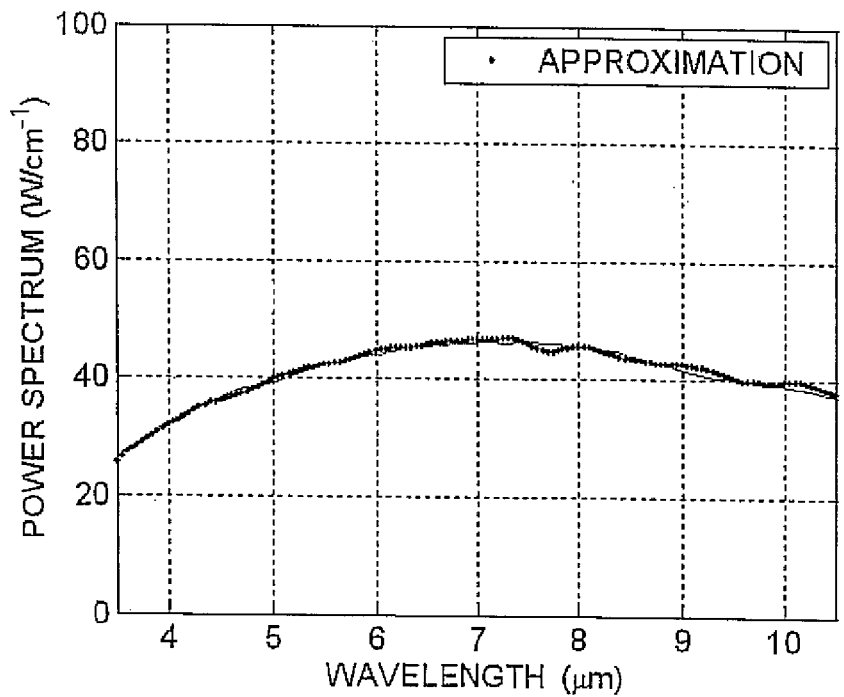

Turning now to FIG. 12, as might be expected, the synthetic sensor yields good results in reconstructing the blackbody spectrum, especially using triangular filters with FWHM of 0.5 μm (FIG. 12A). With a target FWHM of 0.25 μm, however, the approximation has some slight perturbations that are especially visible between 7-8 μm, as shown in FIG. 12B. A more judicious selection of bias voltages and/or greater number of bias voltages (i.e., greater than 21) may reduce these perturbations. Since the blackbody spectrum is a slowly varying function of wavelength, the relatively broad hyperspectral filter (0.5 μm) does not adversely affect the hyperspectral spectrum reconstructed by the QDIP-based synthetic sensor.

Figure 13A:
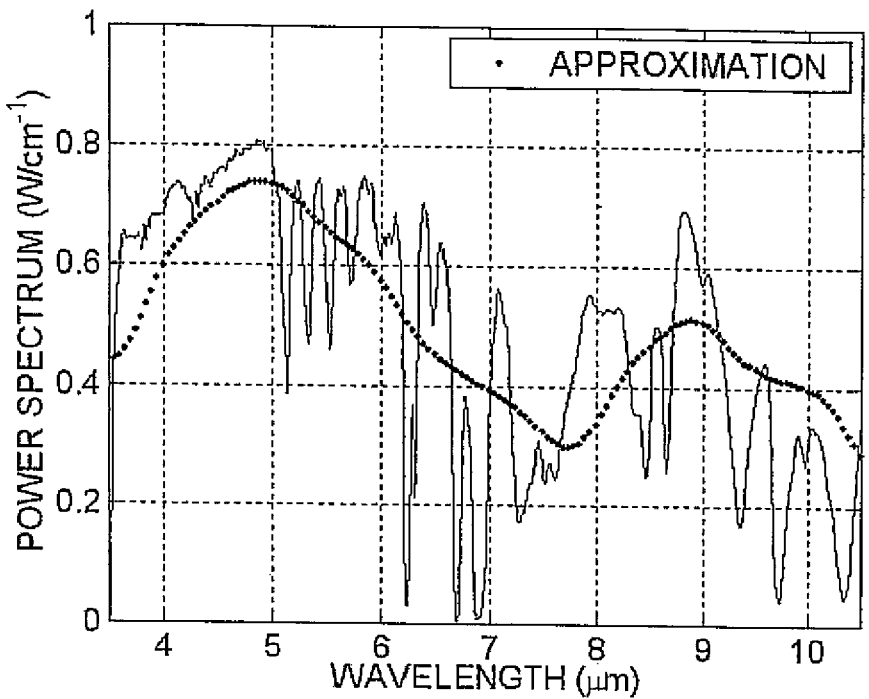
FIGS. 13A-13B are graphs showing hyperspectral reconstruction of a 3 mm Polystyrene spectrum.
Figure 13B:
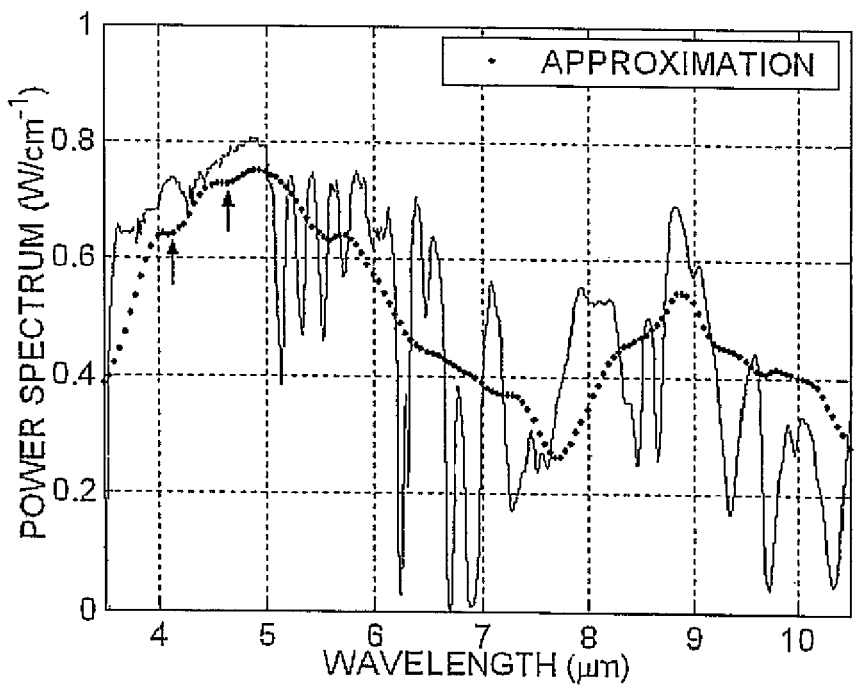

On the other hand, in FIG. 13, the polystyrene spectrum has both large-scale spectral features and narrow absorption lines. The hyperspectral data from the synthetic sensor does capture the overall envelope of the spectrum, but it is unable to resolve spectral features narrower than the target spectral resolution (0.5 μm in FIG. 13A). This is expected since the bands were designed to have a width of 0.5 μm. Notable, however, the hyperspectral data is able to resolve the $H_2O$ and $CO_2$ absorption features between 4 and 5 μm, when filters with a FWHM of 0.25 μm are employed, as shown by the arrows in FIG. 13B. In addition, even though the fine spectral structure of the polystyrene film was not resolved, the hyperspectral-sensor data clearly indicates that there are important differences in the spectra of the black body and that of the polystyrene film. This information may not be as detailed as that obtained with a high-resolution spectrometer, but it is adequate to indicate that a second material is present and demonstrates that power of the proposed processing technique and its potential utility as a synthesized spectrometer.

Figure 14A:
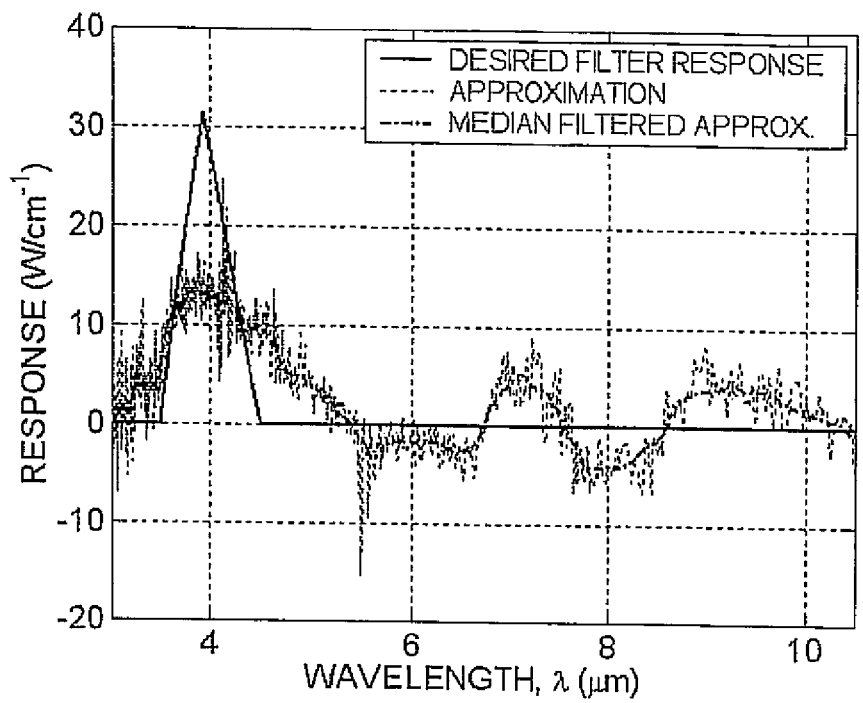
FIGS. 14A-14B are graphs showing synthesized filter approximations.
Figure 14B:
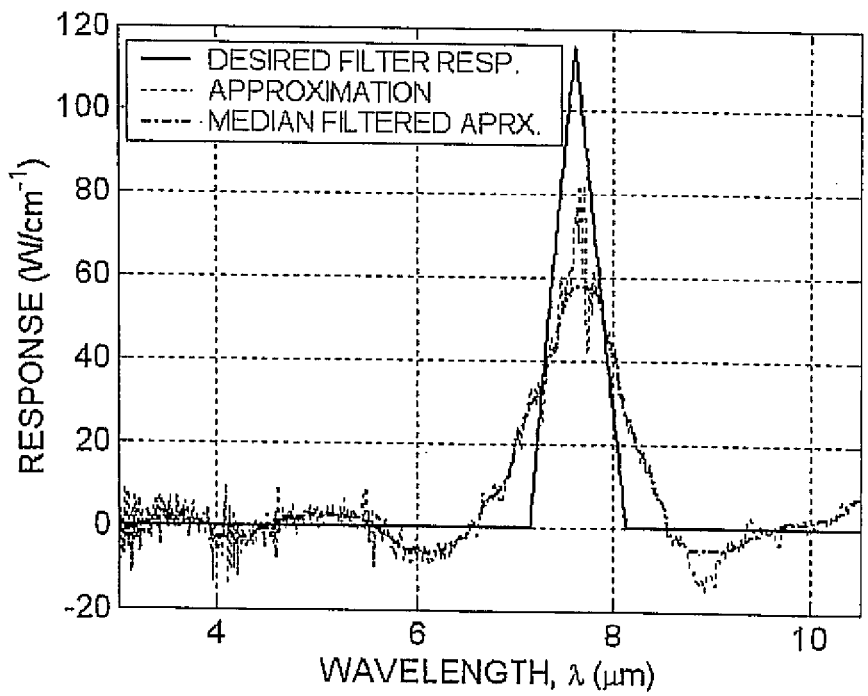

To put the QDIP-based synthetic hyperspectral sensor in better perspective, two more triangular-filter approximations are shown in FIGS. 14A-14B. In both cases, the base width of the triangle is 1.0 μm (which corresponds to a desired FWHM of 0.5 μm) and for which the centers are at 4.0 μm and 7.65 μm for FIGS. 14A and 14B, respectively. Note that the FWHM of the synthesized filter is approximately 1.0 µm, which is twice as much the desired FWHM. This particular implementation has a resolution limit of approximately 0.5 µm (recall that the resolution of the underlying basis spectra is approximately 2 µm or greater. Forcing a resolution limit below 0.5 µm typically will make the approximations and the reconstructions noisier and less dependable, and can introduce spurious peaks. However, the spurious peak problem can be reduced by defining a measure (such as the ratio between the main peak and the first competing peak) that can be incorporated in the penalization in Equation (9). Other methods of suppressing spurious peaks could also be included.

The results for the two multispectral modes (7-band and 3-band) are presented in FIGS. 15A-15B, respectively. For the desired parameters in FIG. 11, the actual values of the spectra, the reconstructed spectra by using ideal (triangular) filters, and the reconstructed spectra by using QDIP-based synthesized filters are shown altogether for comparison. At these multispectral settings, with much wider spectral resolutions, the QDIP can realize spectra that are excellent approximations to the target spectra. The data in FIGS. 15A-15B shows that both multispectral modes can be used to differentiate the polystyrene spectrum from the blackbody spectrum. The two modes were chosen to demonstrate one system with broad spectral coverage and uniform bands and a second system with variable spectral coverage and bandwidths. These examples reinforce the adaptivity of the QDIP sensors. In addition, the reconstruction by either using the ideal or synthesized spectra are is very close, which means that the limitation in accuracy of the reconstruction stems from the mathematical limitation. Even if ideal filters are used (in this case, with FWHM 0.5 µm), the ideal filter is not narrow enough to resolve the fine details of the target spectra.

Various changes and modifications to one or more of the embodiments herein chosen for purposes of illustration will readily occur to those skilled in the art. For example, the principles shown are not limited to IR detectors; they may also be applicable to sensors operating in other spectral regimes such as but not limited to the ultra-violet, visible, infrared and terahertz regimes. To the extent that such modifications and variations do not depart from the spirit of the invention, they are intended to be included within the scope thereof, which is assessed only by a fair interpretation of the following claims.

What is claimed is:

1. A spectrally tunable detector comprising:
   a first barrier region disposed on a first conductive region;
   an absorbing region that is based at least in part on intersubband transitions of quantum states, wherein the absorbing region comprises:
      a first quantum well region disposed on the first barrier region,
      a quantum dot region disposed on the first quantum well region, and
      a second quantum well region disposed on the quantum dot region,
      wherein the second quantum well region has a different material composition than the first quantum well region, and wherein the different material composition cause a vertical asymmetry in a local potential seen by carriers,
   a second barrier region positioned on the second quantum well region, wherein the first barrier region and the second barrier region contribute to the vertical in the local potential; and
   a second conductive region disposed on the second barrier region, wherein both the first conductive region and the second conductive region comprise a highly doped semiconductor material having a same conductivity type.

2. The spectrally tunable detector of claim 1, wherein the second quantum well region has a different thickness than the first quantum well region.

3. The detector of claim 1 wherein a spectral response of the absorbing region peaks at a wavelength greater than 2 µm.

4. The detector of claim 1 further comprising electrical contacts for applying a bias voltage across the absorbing region, wherein a spectral response of the absorbing region changes as a function of the bias voltage.

5. The detector of claim 1 wherein the first barrier region comprises a barrier material, the first quantum well region comprises a well material, and a bandgap of the barrier material is higher than a bandgap of the well material.

6. The detector of claim 1 wherein the first barrier region has a thickness that is a different thickness than the second barrier region.

7. The detector of claim 1 wherein the first barrier region and the second barrier region comprise AlGaAs.

8. The detector of claim 7 wherein the first barrier region has an aluminum fraction that is greater than an aluminum fraction of the second barrier region.

9. A spectrally tunable sensor that can be tuned to synthesize any of a set of target spectral responses, the spectrally tunable sensor comprising:
   a detector comprising:
      a first barrier region disposed on a first conductive region;
      an absorbing region that is based at least in part on intersubband transitions of quantum states, wherein the absorbing region comprises:
         a first quantum well region disposed on the first barrier region,
         a quantum dot region disposed on the first quantum well region, and
         a second quantum well region disposed on the quantum dot region,
      wherein the second quantum well region has a different material composition than the first quantum well region, and wherein the different material composition cause a vertical asymmetry in a local potential seen by carriers,
      a second barrier region positioned on the second quantum well region, wherein the first barrier region and the second barrier region contribute to the vertical asymmetry in the local potential; and
      a second conductive region disposed on the second barrier region, wherein both the first conductive region and the second conductive region comprise a highly doped semiconductor material having a same conductivity type;
   a controller coupled to the detector that tunes the detector to different basis spectral responses; and
   a processor coupled to the detector that combines outputs from the detector as tuned to the basis spectral responses in a manner to synthesize a pre-selected target spectral response.

10. The spectrally tunable sensor of claim 9 wherein the processor makes a weighted combination of the outputs of the detector, the weights determined by projecting the pre-selected target spectral response onto the basis spectral responses of the detector.

11. The spectrally tunable, sensor of claim 9 wherein, within the set of target spectral responses, a center wavelength of the target spectral response can be continuously varied over a predetermined range and a spectral width of the target spectral response can be continuously varied over a predetermined range.

12. The spectrally tunable sensor of claim 9 wherein, for at least one of the target spectral responses, the target spectral response is narrower than any of the basis spectral responses of the detector.

13. The spectrally tunable sensor of claim 9 wherein the processor combines the outputs of the detector in a manner to emulate a hyperspectral sensor.

14. The spectrally tunable sensor of claim 9 wherein the processor combines the outputs of the detector in a manner to emulate a multispectral sensor.

15. The spectrally tunable sensor of claim 9 wherein the processor combines the outputs of the detector in a manner to emulate a spectrometer.

16. A spectrally tunable detector comprising:
 a first barrier region disposed on a first conductive region;
 an absorbing region that is based at least in part on inter-subband transitions of quantum states, the absorbing region positioned on the first barrier region, wherein the absorbing region comprises:
  a plurality of sets of regions with each set comprising:
   a first quantum well region,
   a quantum dot region disposed on the first quantum well region, and
   a second quantum well region disposed on the quantum dot region,
  wherein the second quantum well region has a different material composition than the first quantum well region, and wherein the different material composition cause a vertical asymmetry in a local potential seen by carriers, and
  a barrier region disposed to separate each set of regions from an adjacent set of regions;
 a second barrier region positioned on the second quantum well region of the absorbing region, wherein the first barrier region and the second barrier region have different material compositions and the first barrier region and the second barrier region contribute to the vertical asymmetry in the local potential; and
 a second conductive region disposed on the second barrier region, wherein both the first conductive region and the second conductive region comprise a highly doped semiconductor material having a same conductivity type.

\* \* \* \* \*